United States Patent
Kim (10) Patent No.: US 8,741,160 B2
(45) Date of Patent: *Jun. 3, 2014

(54) METHOD FOR MANUFACTURING SOLAR CELL AND SOLAR CELL MANUFACTURED BY THE SAME METHOD

(75) Inventor: Byung-Jun Kim, Cheonan (KR)

(73) Assignee: Wonik IPS Co., Ltd. (KR)

( * ) Notice: Subject to any disclaimer, the term of this patent is extended or adjusted under 35 U.S.C. 154(b) by 440 days.

This patent is subject to a terminal disclaimer.

(21) Appl. No.: 12/973,267

(22) Filed: Dec. 20, 2010

(65) Prior Publication Data

US 2012/0085729 A1   Apr. 12, 2012

(30) Foreign Application Priority Data

Oct. 8, 2010 (KR) .................. 10-2010-0098218

(51) Int. Cl.
*H01L 31/0236* (2006.01)
*H01L 21/302* (2006.01)
*H01L 21/306* (2006.01)

(52) U.S. Cl.
CPC .... *H01L 31/02366* (2013.01); *H01L 21/30604* (2013.01)
USPC .................. 216/24; 216/38; 216/57; 216/67; 216/68; 216/79; 216/99; 438/71; 438/704; 438/719; 438/753

(58) Field of Classification Search
None
See application file for complete search history.

(56) References Cited

U.S. PATENT DOCUMENTS

| 6,315,858 B1 * | 11/2001 | Shinozuka et al. ...... 156/345.33 |
| 8,071,408 B2 * | 12/2011 | Tanaka et al. ................ 438/38 |
| 8,084,280 B2 * | 12/2011 | Kashkoush et al. ........... 438/19 |
| 2009/0107545 A1 * | 4/2009 | Moslehi ....................... 136/256 |
| 2010/0243040 A1 * | 9/2010 | Kim .............................. 136/255 |
| 2012/0160296 A1 * | 6/2012 | Laparra et al. ................ 136/244 |
| 2012/0181667 A1 * | 7/2012 | Geerligs et al. ............... 257/618 |
| 2012/0204948 A1 * | 8/2012 | Barton et al. ................. 136/256 |

FOREIGN PATENT DOCUMENTS

| EP | 1855322 | 11/2007 |
| EP | 2149915 | 2/2010 |
| WO | 2009/107920 | 9/2009 |
| WO | 2010/110510 | 9/2010 |

OTHER PUBLICATIONS

Extended European Search Report—European Application No. 10015735 issued on May 13, 2011, citing WO 2010/110510, A. Upadhyaya, et al. "Enhanced Front and Rear dielectric passivation for commercially grown Czochralski silicon for high efficiency solar cells," WO 2009/107920, EP 2149915, and EP 1855322.

A. Upadhyaya, et al, "Enhanced Front and Rear dielectric passivation for commercially grown Czochralski silicon for high efficiency solar cells," 2009, pp. 1754-1757.

* cited by examiner

*Primary Examiner* — Anita Alanko
(74) *Attorney, Agent, or Firm* — Cantor Colburn LLP (57) ABSTRACT

Disclosed are a method for manufacturing a solar cell by processing a surface of a silicon substrate for a solar cell, a solar cell manufactured by the method, and a substrate processing system for performing the method. The method for manufacturing a solar cell comprises protrusion forming step including wet-etching process and for forming a plurality of minute protrusions on a light receiving surface of a crystalline silicon substrate, and planarization step of planarizing the bottom surface, the opposite surface to the light receiving surface of the substrate during or after the protrusion forming step.

9 Claims, 5 Drawing Sheets

METHOD FOR MANUFACTURING SOLAR CELL AND SOLAR CELL MANUFACTURED BY THE SAME METHOD

BACKGROUND OF THE INVENTION

1. Field of the Invention

The present invention relates to a solar cell, and particularly, to a method for manufacturing solar cell by processing surface of silicon substrate for solar cell, and solar cell manufactured by the same method.

2. Background of the Invention

A solar cell indicates a cell capable of generating electromotive force by using photo-electromotive effect, one of photoelectric effects.

The solar cell may be classified into a silicon-based solar cell, a compound semiconductor solar cell, a compound or lamination-type solar cell according to material of substrate. Here, the silicon-based solar cell may be categorized into a crystalline silicon solar cell such as a monocrystalline silicon and a multicrystalline silicon, and an amorphous silicon solar cell.

The efficiency of solar cell is determined by a plurality of factors such as reflectivity of a substrate, and is maximized by minimizing reflectivity on a light receiving surface.

In the field of a crystalline silicon solar cell having relatively low fabrication costs, various methods for minimizing reflectivity in order to enhance efficiency for the solar cell are being proposed.

A solar cell (device) manufactured by crystalline silicon, especially, multicrystalline silicon undergoes the following steps.

Firstly, a substrate is manufactured by slicing crystalline silicon ingot.

The sliced substrate undergoes protrusion forming step so as to reduce reflectivity on a light receiving surface and so as to remove damages occurred on the surface of the substrate during the slicing process. As a result, a plurality of protrusions are formed on the light receiving surface of the substrate.

The substrate having undergone the protrusion forming step undergoes impurity doping and diffusion processes, thereby having semiconductor structure. After forming anti-reflection film on the light receiving surface, electrodes are formed on the light receiving surface and the bottom surface. As a result, a solar cell is manufactured.

In case of performing the protrusion forming step by wet-etching process, not only the light receiving surface but also the bottom surface of the substrate are etched. This may cause the bottom surface of the substrate to have undesirable protrusions.

In order to solve the problem, in case of performing the protrusion forming step by wet-etching process, a mask for preventing formation of protrusions is formed on the bottom of the substrate.

However, the mask has to be removed after forming the mask on the bottom surface of the substrate. This may cause the entire processes to be complicated, and cause the manufacturing costs to be increased.

SUMMARY OF THE INVENTION

Therefore, an object of the present invention is to provide a method for manufacturing a solar cell capable of simplifying the entire processes and reducing manufacturing costs by additionally performing a planarization process for removing rises or minute protrusions formed on the bottom surface of a substrate during wet-etching process, without forming a mask for preventing formation of minute protrusions on the bottom surface of the substrate in a case that a step of forming minute protrusions on a light receiving surface of the substrate includes wet-etching process, and a solar cell manufactured by the method.

To achieve these and other advantages and in accordance with the purpose of the present invention, as embodied and broadly described herein, there is provided a method for manufacturing a solar cell, the method comprising: protrusion forming step including wet-etching process, and for forming a plurality of minute protrusions on a light receiving surface of a crystalline silicon substrate; and planarization step of planarizing the bottom surface, the opposite surface to the light receiving surface of the substrate during or after the protrusion forming step.

The protrusion forming step may be executed only by the wet-etching process.

The protrusion forming step may comprise first protrusion forming step of forming a plurality of first protrusions on external surfaces of the substrate by etching the substrate using acid aqueous solution; and second protrusion forming step of forming a plurality of second protrusions smaller than the first protrusions, by dry-etching a light receiving surface of the external surfaces having thereon the first protrusions through the first protrusion forming step, the light receiving surface where anti-reflection film is to be formed. The planarization step may be executed before or after the second protrusion forming step.

The protrusion forming step may comprise surface damage removing step of removing surface damages of surfaces of the substrate by wet-etching process; and minute protrusion forming step of forming minute protrusions by dry-etching the light receiving surface of the substrate. The planarization step may be executed before or after the protrusion forming step.

The planarization step may be executed by wet-etching process, or by dry-etching process by making etching gas into plasma state.

The etching gas may include at least one of chlorine (Cl), fluorine (F), bromine (Br), and oxygen ($O_2$).

The planarization step may be executed by covering a tray loaded with a plurality of substrates, with a cover member formed with a plurality of openings.

The cover member may be formed such that a space formed between the substrates and the openings is open toward side surfaces of the cover member.

The method may further comprise substrate inverting step of inverting the light receiving surface and the bottom surface of the substrate before the protrusion forming step, or after the planarization step.

The method may further comprise semiconductor layer forming step of forming p-n junction structure before or after the protrusion forming step.

To achieve these and other advantages and in accordance with the purpose of the present invention, as embodied and broadly described herein, there is also provided a solar cell manufactured by the method for manufacturing a solar cell.

The present invention may have the following advantages.

Firstly, the entire processes may be simplified and the manufacturing costs may be reduced by additionally performing a planarization process for removing protrusions and/or minute protrusions formed on the bottom surface of a substrate during wet-etching process, without forming mask for preventing formation of protrusions on the bottom surface of the substrate in a case that step of forming minute protrusions on a light receiving surface of the substrate includes wet-etching process.

Secondly, in the conventional art, mask for preventing formation of a protrusions is formed on the bottom of the substrate in case of performing the protrusion forming step by wet-etching process. Then, the mask has to be removed after forming the mask on the bottom surface of the substrate. This may cause the entire processes to be complicated.

On the contrary, in the present invention, without forming mask on the bottom surface of the substrate, planarization step of removing rises (or minute protrusions) formed on the bottom surface of the substrate during wet-etching process may be further comprised. This may simplify the entire processes more than in the conventional art.

Thirdly, in the conventional art, since mask for etching prevention is formed on the bottom surface of the substrate, surface damages may remain on the bottom surface of the substrate. This may influence on later processes.

However, in the present invention, planarization step may be additionally performed with respect to the bottom surface of the substrate without performing mask forming process and mask removing process. This may allow surface damages remaining on the bottom surface of the substrate to be completely removed.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of the present invention, with reference to the accompanying drawings.

Hereinafter, a method for manufacturing a solar cell, a solar cell manufactured by the method, and a substrate processing system for performing the method will be explained in more detail with reference to the attached drawings.

Figure 1:
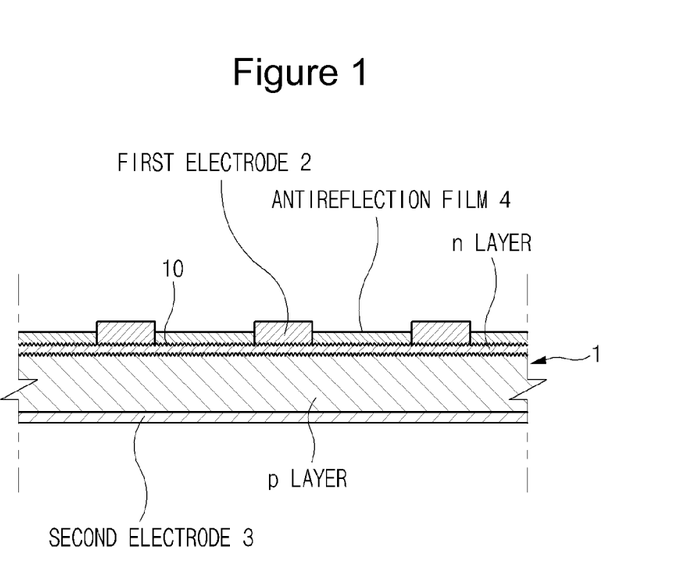
FIG. 1 is a sectional view showing an example of a structure of a solar cell.
Figure 2:
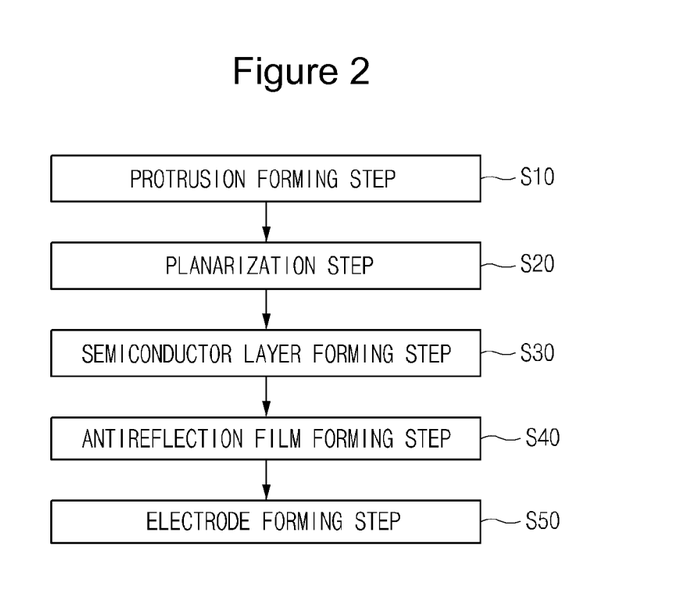
FIG. 2 is a flowchart showing procedures for manufacturing a solar cell according to the present invention.

FIG. 1 is a sectional view showing an example of a structure of a solar cell, and FIG. 2 is a flowchart showing procedures for manufacturing a solar cell according to the present invention.

As shown in FIG. 1, an example of the solar cell manufactured by a method for manufacturing a solar cell according to the present invention comprises a substrate 1 having 'p-n' junction structure, first electrode 2 and second electrode 3 respectively formed on a light receiving surface (upper surface) and the bottom surface of the substrate, and anti-reflection film 4 formed on the light receiving surface of the substrate 1.

The substrate 1 may be formed of monocrystalline or multicrystalline silicon, more preferably, multicrystalline silicon.

Semiconductor structure, electrode, etc. of the substrate may have various modifications according to a type of a solar cell. For instance, the electrode may be formed only on the bottom surface of the substrate 1, not on the light receiving surface.

As shown in FIG. 2, the method for manufacturing a solar cell comprises protrusion forming step S10 including wet-etching process and for forming a plurality of minute protrusions 20 on a light receiving surface of a crystalline silicon substrate 1, and planarization step S20 of planarizing the bottom surface, the opposite surface to the light receiving surface of the substrate 1 during or after the protrusion forming step S10.

1. Protrusion Forming Step

This step is for forming a plurality of minute protrusions 20 on the light receiving surface of the substrate 1 so as to reduce reflectivity, and includes wet-etching process. This step is performed by wet-etching process, or through combinations of wet-etching process and dry-etching process.

First Embodiment of the Protrusion Forming Step
(Performed Only by Wet-Etching Process)

In case of performing the protrusion forming step S10 only by wet-etching process, alkali aqueous solution or acid aqueous solution may be used.

When the silicon substrate is formed of monocrystalline silicon, the protrusion forming step is performed by using alkali aqueous solution. On the other hand, when the silicon substrate is formed of multicrystalline silicon, the protrusion forming step is performed by using acid aqueous solution such as acid aqueous solution of HF and $HNO_3$.

Second Embodiment of the Protrusion Forming Step
(Performed through First Combinations of
Wet-Etching Process and Dry-Etching Process)

Figure 3:
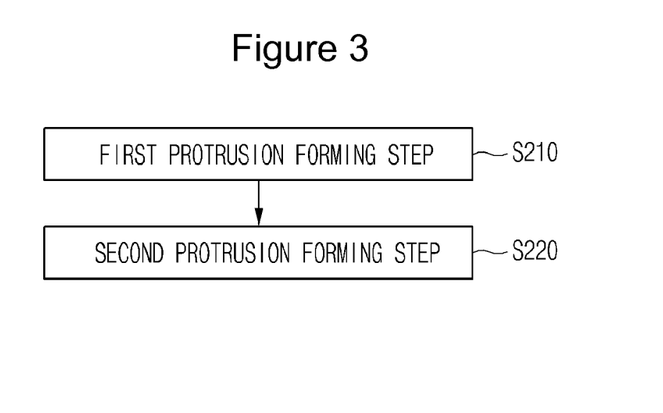
FIG. 3 is a flowchart showing second embodiment of protrusion forming step of method for manufacturing a solar cell of FIG. 1.
Figure 4:
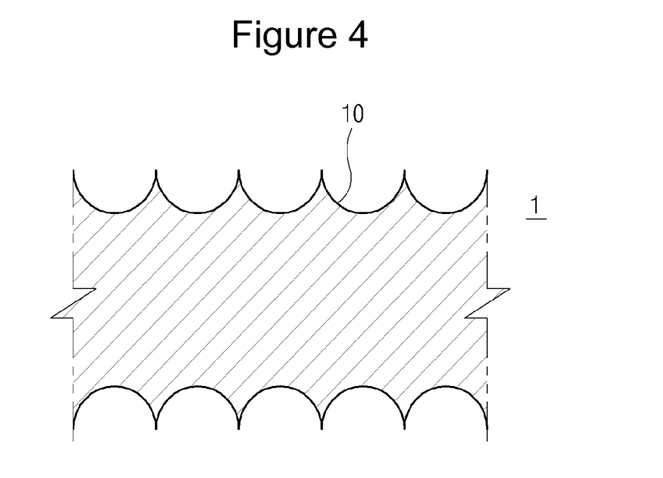
FIG. 4 is a partial sectional view showing a substrate surface-processed by first protrusion forming step of the protrusion forming step of FIG. 3.
Figure 5:
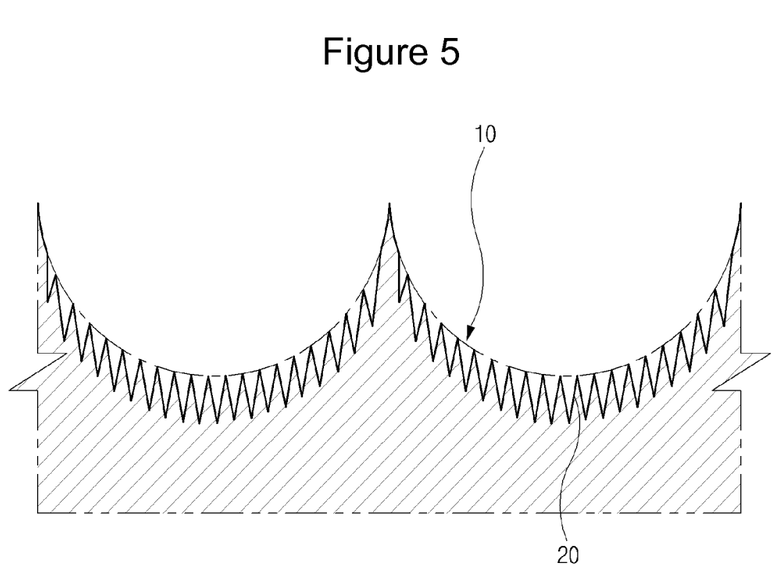
FIG. 5 is a conceptual view showing a state that first and second protrusions have been formed by the protrusion forming step of FIG. 3.
Figure 6:
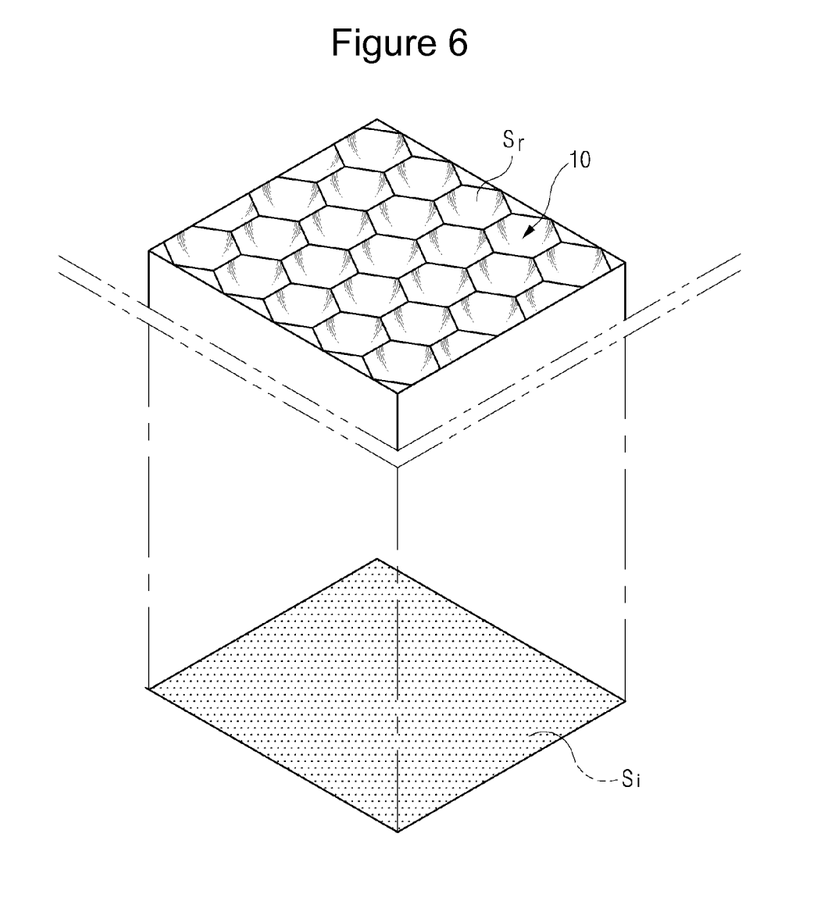
FIG. 6 is a conceptual view showing a state that minute protrusions have been formed by the first protrusion forming step of the protrusion forming step in the method of manufacturing a solar cell of FIG. 1.

FIG. 3 is a flowchart showing second embodiment of protrusion forming step of a method for manufacturing a solar cell of FIG. 1, FIG. 4 is a partial sectional view showing a substrate surface-processed by first protrusion forming step of the protrusion forming step of FIG. 3, FIG. 5 is a conceptual view showing a state that first and second protrusions have been formed by the protrusion forming step of FIG. 3, and FIG. 6 is a conceptual view showing a state that minute protrusions have been formed by the first protrusion forming step of the protrusion forming step in the method of manufacturing a solar cell of FIG. 1.

FIGS. 4 to 6 are schematically shown for convenience. Etching depth, height of uppermost end in a substrate, and a size of the substrate may have deviations, and sectional shape or substantial shape are irregular and various.

As shown in FIG. 3, the protrusion forming step S10 through combinations of wet-etching process and dry-etching process includes first protrusion forming step S210 of forming a plurality of first protrusions 10 on external surfaces of the substrate 1 by etching the substrate 1 using acid aqueous solution, and second protrusion forming step S220 of forming a plurality of second protrusions 20 by dry-etching the light receiving surface of the external surfaces formed with the first protrusions 10 through the first protrusion forming step S210, the light receiving surface where anti-reflection film 4 is to be formed.

The first protrusion forming step S210 is for forming the first protrusions 10 by etching the external surfaces of the crystalline silicon substrate 1 by using acid aqueous solution. Especially, the first protrusion forming step S210 is for forming the first protrusions 10 on the external surfaces of the substrate 1 as shown in FIG. 4.

In case of using acid aqueous solution in the first protrusion forming step S210, reflectivity on the light receiving surface of the substrate 1 where anti-reflection film 4 is to be formed is much lowered than in case of using alkali aqueous solution in the first protrusion forming step S210. This may increase a light receiving amount to enhance performance of the solar cell.

In case of using alkali aqueous solution in the first protrusion forming step S210, the step is much influenced by material of the substrate 1. On the contrary, in case of using acid aqueous solution, dependency on the material of the substrate 1 may be reduced.

The acid aqueous solution used in the first protrusion forming step S210 may be aqueous solution including $HNO_3$ and HF, and weight ratio, a concentration, etc., may be determined with consideration of etching temperature, etching depth, etc.

Preferably, the acid aqueous solution used in the first protrusion forming step S210 is aqueous solution including $HNO_3$ and HF having weight ratio of 1:1~5.5:1. Here, the aqueous solution may further include surfactant and catalyst, etc.

As the acid aqueous solution, may be used aqueous solution including $HNO_3$, HF and $CH_3COOH$ (or deionized water).

Preferably, etching depth in the first protrusion forming step S210 is in the range of 1 μm~10 μm.

The first protrusions 10 in the first protrusion forming step S210 may desirably be formed by forming grooves of semispherical shape (supposing that grooves of ideal shape are formed) having etching depth of 1 μm~10 μm, and diameter of 2 μm~20 μm.

The first protrusion forming step S210 may be performed by inline method or dipping method. Here, the inline method is for performing etching process by transferring the substrate 1 by roller in a wet station containing alkali aqueous solution or acid aqueous solution (preferably, acid aqueous solution). And, the dipping method is for performing etching process by dipping the substrate 1 in a wet station containing alkali aqueous solution or acid aqueous solution (preferably, acid aqueous solution).

In case of performing the first protrusion forming step S210 by the inline method, etching process may be performed at temperature of 6~10° C. for 1~10 minutes.

In case of performing the first protrusion forming step S210 by the dipping method, etching process may be performed at a temperature of 6~10° C. for 15~25 minutes.

The first protrusion forming step S210 performed by wet-etching process using acid aqueous solution may further include subsequent process for drying and washing the surface of the substrate 1 having undergone etching process.

As shown in FIG. 6, it is assumed that, among the external surfaces formed with the first protrusions 10 through the first protrusion forming step S210, an area of a surface where anti-reflection film 4 is to be formed is a substantial surface area (Sr), and an area of a surface which is in a completely flat state is an ideal surface area (Si). Under these assumptions, a ratio between the substantial surface area (Sr) and the ideal surface area of the crystalline silicon substrate 1 having undergone the first protrusion forming step S210 is preferably in the range of 1.2~3.2.

If the ratio is less than 1.2, there is a problem that lowering of reflectivity due to the first protrusion forming step S210 is not great since a small number of the first protrusions 10 are formed.

If the ratio is more than 3.2, there is a problem that a surface processing effect is reduced since reaction by plasma in subsequent step, second protrusion forming step S220 is not great. Furthermore, if the ratio is more than 3.2, there is a problem that gap is formed since diffusion of metallic material for forming electrode is interfered in subsequent step (electrode forming step S50).

Before the first protrusion forming step S210, the method of the present invention may further comprise substrate processing step of processing the silicon substrate 1 by slicing a silicon ingot with using a wire saw.

After the substrate processing step and before the first protrusion forming step S210, the method of the present invention may further comprise surface damage removing step for removing damages on the surfaces of the substrate 1 during the substrate processing step.

The surface damage removing step is for removing surface damages of the substrate 1 by using alkali aqueous solution or acid aqueous solution. The surface damage removing step may be performed together with the first protrusion forming step S210.

The second protrusion forming step S220 is for forming a plurality of second protrusions 20 by dry-etching a light receiving surface of the external surfaces surface-processed in the first protrusion forming step S210, the light receiving surface where anti-reflection film 4 is to be formed. The second protrusion forming step S220 is for forming a plurality of second protrusions 20 on the light receiving surface of the substrate 1 as shown in FIG. 5. Here, the second protrusions 20 are smaller than the first protrusions 10. The first protrusions 10 have a width of 2 μm~20 μm and a height of 1 μm~10 μm, and the second protrusions 20 have a size of 100 nm~800 nm, such as height of 1 μm~10 μm.

The dry etching performed in the second protrusion forming step S220 is for etching the substrate 1 by plasmarizing etching gas, and may be performed by reactive ion etching (RIE) method or by using ICP (Inductively Coupled Plasma).

The etching gas used for the dry-etching may include $Cl_2$/$CF_4$/$O_2$, $SF_6$/$O_2$, $CHF_3$/$SF_6$/$O_2$, $NF_3$ and $F_2$, and a mixture thereof. Here, the dry etching is performed for about several seconds~several minutes.

When the dry-etching is performed by the RIE method, a cover member (not shown) formed with a plurality of openings may be installed above the substrate 1 so as to accelerate formation of the second protrusions 20.

Here, the dry-etching may be performed by transferring a tray loaded with a plurality of substrates 1, and by loading the substrates onto a substrate supporting plate inside a dry-etching apparatus.

The substrate 1 having undergone a surface process in the second protrusion forming step S220 is shown in FIG. 5.

A plurality of second protrusions 20 smaller than the first protrusions 10 formed in the first protrusion forming step S210 are formed on the surface of the substrate 1.

As shown in FIG. 5, each of the second protrusions 20 has a triangular sectional surface, and has one side towards a top side of the first protrusions 10 and shorter than another side.

Third Embodiment of the Protrusion Forming Step (Performed through Second Combinations of Wet-Etching Process and Dry-Etching Process)

Figure 7:
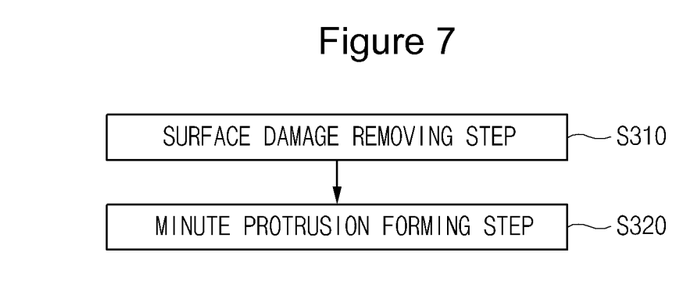
FIG. 7 is a flowchart showing a third embodiment of protrusion forming step of a method for manufacturing a solar cell of FIG. 1.

FIG. 7 is a flowchart showing a third embodiment of protrusion forming step of a method for manufacturing a solar cell of FIG. 1.

The protrusion forming step S10 is performed through another combinations of wet-etching process and dry-etching process. And, the protrusion forming step S10 includes surface damage removing step S310 of removing surface damages occurring on the surface of the substrate 1 by wet-etching process, and minute protrusion forming step S320 of forming a plurality of second protrusions 20 by dry-etching the light receiving surface (upper surface) of the substrate 1 where anti-reflection film 4 is to be formed.

The surface damage removing step S310 is for removing surface damages formed with the surfaces of the substrate 1 during slicing process for manufacturing the crystalline silicon substrate 1, by using acid aqueous solution or alkali aqueous solution.

As the acid aqueous solution, may be used a mixture of $HNO_3$ and HF, $HNO_3$,HF and $CH_3COOH$ (or deionized water). Here, a ratio of $H_2O$ for the mixture may be determined by those who skilled in the art.

In case of using alkali aqueous solution, the surface damage removing step S310 may be performed at temperature of 80☐~90☐ for about 15~25 minutes. As the alkali aqueous solution, NaOH or KOH may be used. Alternatively, IPA (2-isopropyl-alcohol) may be added to the alkali aqueous solution.

When the silicon substrate is monocrystalline, the surface damage removing step S310 is preferably performed by using alkali aqueous solution. On the other hand, when the silicon substrate is multicrystalline, the surface damage removing step S310 is preferably performed by using acid aqueous solution.

The minute protrusion forming step S320 is performed in a similar manner to the second protrusion forming step S220 of the second embodiment, and thus its detailed explanations will be omitted.

2. Planarization Step

Figure 8:
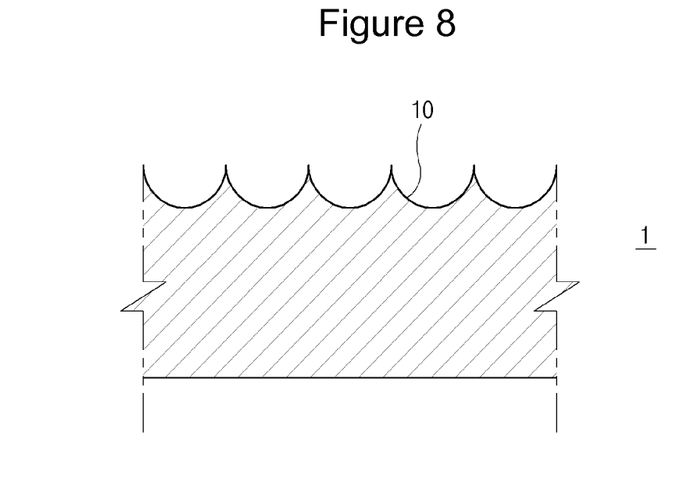
FIG. 8 is a partial sectional view of a substrate having undergone first protrusion forming step of protrusion forming step, and planarization step in the method for manufacturing a solar cell of FIG. 2.

FIG. 8 is a partial sectional view of a substrate having undergone first protrusion forming step of protrusion forming step, and planarization step in the method for manufacturing a solar cell of FIG. 2.

The planarization step S20 is for planarizing the bottom surface of the substrate 1, i.e., the opposite surface to a light receiving surface where anti-reflection film 4 is to be formed. That is, the planarization step S20 is for removing undesirable minute protrusions such as protrusions formed on the bottom surface of the substrate 1 by wet-etching process in the protrusion forming step S10. This planarization step S20 may be performed by wet-etching process or dry-etching process.

The planarization step S20 may be performed during the protrusion forming step S10, more concretely after wet-etching process in the protrusion forming step S10, or after the protrusion forming step S10.

In case of the first embodiment of the protrusion forming step S10, the planarization step S20 may be performed after the protrusion forming step S10.

And, in case of the second embodiment of the protrusion forming step S10, the planarization step S20 may be performed after the first protrusion forming step S210 but before the second protrusion forming step S220, or after the second protrusion forming step S220.

As shown in FIG. 8, in the planarization step S20, the first protrusions 10 are removed from the bottom surface of the substrate 1, among the external surfaces formed with the first protrusions 10 in the first protrusion forming step S210. Here, the bottom surface is the opposite surface to the light receiving surface where anti-reflection film 4 is to be formed.

In case of the third embodiment of the protrusion forming step S10, the planarization step S20 may be performed after the surface damage removing step S310 but before the minute protrusion forming step S320, or after the minute protrusion forming step S320.

Hereinafter, the planarization step S20 will be explained in more detail.

The planarization step S20 is for removing protrusions formed on the bottom surface of the substrate 1 in the protrusion forming step S10. In a similar manner to the second protrusion forming step S220 of the second embodiment, the planarization step S20 may be performed by wet-etching process using alkali aqueous solution or acid aqueous solution, or by dry-etching process such as RIE and ICP methods.

In case of performing the planarization step S20 by wet-etching process, only the bottom surface of the substrate 1 has to be etched. Accordingly, it is preferable to adopt inline method for performing etching process by transferring the substrate 1 by roller in a wet station containing alkali aqueous solution or acid aqueous solution (preferably, acid aqueous solution).

In case of performing the planarization step S20 by dry-etching process, the substrate 1 is loaded into a processing module (not shown), a dry-etching apparatus so that the bottom surface of the substrate 1 can be towards an upper side. Then, the substrate 1 is etched by a depth of about 3~10 um with using RIE or ICP.

The processing module for performing the planarization step S20 may have any configurations to make etching gas into plasma state, i.e., to perform RIE and ICP.

For uniform etching, the planarization step S20 may be performed after covering a tray loaded with a plurality of substrates 1 with a cover member (not shown) formed with a plurality of openings.

The cover member may be formed of various materials according to processing methods. Preferably, the cover member is formed of material having high endurance with respect to plasma. The cover member may be formed of aluminum or alloy thereof.

Preferably, the cover member is formed so that a space formed between the substrate 1 and the openings can be open towards side surfaces of the cover member.

If the cover member is formed so that a space formed between the substrate 1 and the openings can be open towards side surfaces, etching materials occurring when the silicon substrate 1 is etched move along the opened side surfaces of the cover member. This may allow the substrate 1 to undergo the planarization step S20 more smoothly.

A process for covering the tray with the cover member and a process for uncovering the cover member from the tray may be performed outside or inside the processing module. However, the processes are preferably performed outside the processing module with consideration of configurations of the processing module.

The etching gas used for the planarization step S20 may include at least one of chlorine (Cl), fluorine (F), bromine (Br), and oxygen ($O_2$), and may include $SF_6/O_2$, $SF_6/N_2$ and $NF_3$, $CF_4$, $NF_3$, $ClF_3$, $F_2$ and a mixture thereof. Here, the etching is performed for about several seconds~several minutes.

The planarization step S20 may shorten a surface processing time with respect to the substrate 1 by omitting the conventional processes for forming mask on the bottom surface of the substrate and then removing the mask so as to prevent formation of protrusions on the bottom surface of the substrate 1 by wet-etching process.

More concretely, in case of manufacturing crystalline silicon substrate for a solar cell having no protrusions on the bottom surface of the substrate 1, mask (not shown) for preventing formation of protrusions is formed on the bottom surface of the substrate 1 before the first protrusion forming step S210. Next, the substrate 1 is etched, and then the mask formed on the bottom surface of the substrate 1 is removed.

The planarization step S20 does not require the mask forming process and the mask removing process applied to the conventional wet etching process. Accordingly, manufacturing costs and manufacturing time may be reduced, and the substrate 1 may have a flat bottom surface.

The processing module for performing the planarization step S20 may constitute a part of a substrate processing system. Here, the substrate processing system includes a substrate exchanging module for loading the substrate 1 on a tray, a load lock module for receiving the tray from the substrate exchanging module and then transferring the tray to a processing module in vacuum pressure, and an unload lock module for receiving the tray having been completely processed from the processing module.

Here, the substrate processing system may be configured as inline type in which a plurality of modules are sequentially arranged, or a cluster type in which a plurality of processing modules are installed to one transfer module having the substrate exchange module coupled thereto and having a transfer robot installed thereat.

When the planarization step S20 is performed by a dry etching process, and the protrusion forming step S10 includes a dry etching process (second and third embodiments of the protrusion forming step S10), the entire processes are performed by a first processing module for performing the planarization step S20, and a second processing module for performing a dry etching process of the protrusion forming step S10 (the second protrusion forming step S220 or the minute protrusion forming step S320). Here, the first and the second processing modules may constitute one substrate processing system.

When the substrate processing system is configured as inline type, the first and the second processing modules may be sequentially arranged. However, when the substrate processing system is configured as a cluster type, the first and the second processing modules may be coupled to a transfer module.

In a case that the first and the second processing modules constitute one substrate processing system, may be further performed substrate inverting step of inverting the light receiving surface and the bottom surface of the substrate 1 before or after the planarization step S20, in order to sequentially perform the planarization step S20 and the dry etching process of the protrusion forming step S10.

Here, the substrate processing system may further include a substrate inverting module for inverting the substrate 1 loaded on a tray so that the light receiving surface of the substrate 1 can be towards the upper side when the tray is transferred to the second processing module from the first processing module, or when the tray is transferred to the first processing module from the second processing module.

In case of performing the second protrusion forming step before the planarization step S20 by the substrate inverting module, the substrate inverting step may be performed so that the bottom surface of the substrate 1 loaded on a tray can be towards the upper side, after the dry etching process of the protrusion forming step S10 and before the planarization step S20.

The silicon substrate 1 having undergone the protrusion forming step S10 and the planarization step S20 undergoes S30, S40 and S50 shown in FIG. 2, thereby being manufactured as a device for a solar cell. Here, S30 is semiconductor layer forming step of forming 'p-n' junction structure, and S40 is anti-reflection film forming step of forming anti-reflection film 4 on the surface of the substrate 1. And, S50 is electrode forming step of forming one or more electrodes 2 and 3 on a light receiving surface and the bottom surface of the substrate 1, or only on the bottom surface of the substrate.

Each step of the method for manufacturing a solar cell includes various processes, and detailed descriptions thereof will be omitted for convenience.

The planarization step S20 may be performed even after the semiconductor layer forming step S30 according to a structure of a semiconductor formed on the substrate 1.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A method for manufacturing a solar cell, the method comprising:
   protrusion forming step including wet-etching process, for forming a plurality of minute protrusions on a light receiving surface of a crystalline silicon substrate;
   wherein the protrusion forming step comprises:
   first protrusion forming step of forming a plurality of first protrusions on both of the light receiving surface and the bottom surface of the crystalline silicon substrate by etching the crystalline silicon substrate using acid aqueous solution; and second protrusion forming step of forming a plurality of second protrusions smaller than the first protrusions, by dry-etching external surfaces of the light receiving surface having the first protrusions thereon through the first protrusion forming step, the light receiving surface where anti-reflection film is to be formed, and planarization step of planarizing a bottom surface, which is opposite to the light receiving surface of the crystalline silicon substrate, to remove the plurality of the first protrusions formed in the first protrusion forming step, after the first protrusion forming step and before the second protrusion forming step.

2. The method of claim 1, wherein the protrusion forming step comprises:

surface damage removing step of removing surface damages of surfaces of the crystalline silicon substrate by wet-etching process; and minute protrusion forming step of forming minute protrusions by dry-etching the light receiving surface of the crystalline silicon substrate.

3. The method of claim 1, wherein the planarization step is executed by wet-etching process.

4. The method of claim 1, wherein the planarization step is executed by dry-etching process by making etching gas into plasma state.

5. The method of claim 4, wherein the etching gas includes at least one of chlorine (Cl), fluorine, bromine (Br) and oxygen ($O_2$).

6. The method of claim 1, wherein the planarization step is executed by covering a tray loaded with a plurality of crystalline silicon substrates, with a cover member formed with a plurality of openings.

7. The method of claim 6, wherein the cover member is formed such that a space formed between the crystalline silicon substrate and the openings is open toward side surfaces of the cover member.

8. The method of claim 1, further comprising a substrate inverting step of inverting the light receiving surface and the bottom surface of the crystalline silicon substrate before or after the planarization step.

9. The method of claim 1, further comprising semiconductor layer forming step of forming p-n junction structure before the protrusion forming step, or after the planarization step.

* * * * *